United States Patent
Liu et al.

(10) Patent No.: US 8,975,164 B2
(45) Date of Patent: Mar. 10, 2015

(54) METHOD OF MANUFACTURING SEMICONDUCTOR DEVICE

(71) Applicant: National Chiao Tung University, Hsinchu (TW)

(72) Inventors: Po-Tsun Liu, Hsinchu (TW); Wei-Ya Wang, Taoyuan County (TW); Li-Feng Teng, Taoyuan County (TW)

(73) Assignee: National Chiao Tung University, Hsinchu (TW)

( * ) Notice: Subject to any disclaimer, the term of this patent is extended or adjusted under 35 U.S.C. 154(b) by 9 days.

(21) Appl. No.: 13/905,323

(22) Filed: May 30, 2013

(65) Prior Publication Data
US 2014/0193964 A1    Jul. 10, 2014

(30) Foreign Application Priority Data

Jan. 7, 2013   (TW) .............................. 102100413 U

(51) Int. Cl.
*H01L 29/786* (2006.01)
*H01L 21/322* (2006.01)

(52) U.S. Cl.
CPC .................................. *H01L 21/3225* (2013.01)
USPC ............................ 438/473; 438/593; 438/780

(58) Field of Classification Search
CPC .................. H01L 2924/0002; H01L 21/28773
USPC ......................................... 438/473, 593, 780
See application file for complete search history.

(56) References Cited

U.S. PATENT DOCUMENTS

| 8,105,960 B2 * | 1/2012 | Doris et al. .................... 438/780 |
| 2004/0134515 A1 * | 7/2004 | Castrucci .......................... 134/2 |
| 2006/0178006 A1 * | 8/2006 | Xu et al. ........................ 438/643 |
| 2009/0186194 A1 * | 7/2009 | Grant ............................. 428/164 |
| 2009/0212287 A1 * | 8/2009 | Nathan et al. .................... 257/57 |
| 2012/0064710 A1 * | 3/2012 | Sim et al. ....................... 438/593 |
| 2013/0240881 A1 * | 9/2013 | Nakamura et al. ............... 257/43 |

OTHER PUBLICATIONS

Wei-Ya Wang, "Study of Supercritical Fluid Technology on Novel Transparent Amorphous Aluminum Zinc Tin Oxide Thin Film Transistors", Jul. 10, 2012, oral examination for Master degree in National Chiao Tung University, Taiwan.

* cited by examiner

*Primary Examiner* — Brett Feeney
*Assistant Examiner* — Damian A Hillman
(74) *Attorney, Agent, or Firm* — Bacon & Thomas, PLLC

(57) ABSTRACT

The present invention provides a method of manufacturing a semiconductor device. The method at least comprises the following steps. First, the semiconductor device, which comprises a gate, a gate dielectric layer, an active layer, a source and a drain, is manufactured. However, the semiconductor device has a plurality of defects, and the active layer is a metal oxide thin film. After annealing the semiconductor device, it will be transferred into a chamber. A final step of injecting a supercritical fluid carried with a co-solvent into the chamber is then performed to modify the abovementioned defects.

5 Claims, 8 Drawing Sheets

METHOD OF MANUFACTURING SEMICONDUCTOR DEVICE

BACKGROUND OF THE INVENTION

1. Field of the Invention

The present invention relates to a method of manufacturing a semiconductor device, particularly to a method of manufacturing a semiconductor device by a supercritical fluid carried with a co-solvent to modify the defects of semiconductor device.

2. Description of the Prior Art

Accompanying with the flourishing development of the Flat Panel Display (FPD) technology, the application of Thin Film Transistor (TFT) has been paid great attention. At present, the thin film device has been used to substitute the external integrated circuit set, in order to produce the System on Panel (SoP) for various displays and reach the goal of light, thin, low cost and high yield. Because the amorphous metal oxide semiconductor has the characteristics of high carrier mobility, low process temperature, high transmittance, excellent homogeneity and transparency, which is very suitable for applying in future relevant display and products and will become one of the mainstreams for the display of next generation.

However, above-mentioned technology and material have had many problems all the time, which face the bottleneck on the technological break-through. Firstly, based on the process of thin film transistor at present, there are often a lot of defects in the thin film transistor. The existence of these defects will cause low carrier mobility and low current. At the same time, they can cause high leakage current of device and reduce the reliability device.

Recently, although there are many methods used to modify the defects, such as the hydrogen or oxygen or ammonia plasma treatment, the high-pressure and high-temperature steam treatment, but the above-mentioned methods will not be applicable in the near future in case of reducing the manufacturing cost and responding the formation of thin film transistor on the flexible substrate.

In addition, most widely applied high-performance oxide thin film transistor comprises the rare scattering elements and rare elements, such as the indium, gallium etc. However, the price of these rare elements is higher, because they are rare, furthermore, the control of thin film transistor containing rare elements is not easy, and it will increase the difficulty of whole process.

SUMMARY OF THE INVENTION

Inasmuch as the above-mentioned description, the present invention provides a method of manufacturing a semiconductor device. The method comprises the following steps. Firstly, the semiconductor device, which comprises a gate, a gate dielectric layer, an active layer, a source and a drain, is manufactured. However, the semiconductor device has a plurality of defects, and the active layer is a metal oxide thin film. After annealing the semiconductor device, it will be transferred into a chamber. The temperature and pressure of chamber are 100° C. to 200° C. and 1500 lb/in$^2$ to 3000 lb/in$^2$, respectively. A final step of injecting a supercritical fluid carried with a co-solvent into the chamber is then performed to modify the abovementioned defects.

In an embodiment of the present invention, the above-mentioned metal oxide thin film does not contain indium element and gallium element.

In an embodiment of the present invention, wherein the preparation of the above-mentioned semiconductor device further comprises the following steps: Firstly, forming a gate dielectric layer on the gate, and forming an active layer on the gate dielectric layer. Then, disposing a source and a drain on the active layer is carried out.

In an embodiment of the present invention, wherein after the gate dielectric layer is formed on the gate, it further comprises the following step: Conducting a first plasma treatment. In addition, after the active layer is formed on the gate dielectric layer, it further comprises the following step: Conducting a second plasma treatment. Preferably, the above-mentioned first plasma treatment and second plasma treatment are the hydrogen plasma treatment.

In an embodiment of the present invention, wherein the temperature for annealing the semiconductor device is between 300° C. and 450° C.

In an embodiment of the present invention, the co-solvent comprises water.

In an embodiment of the present invention, the co-solvent comprises surfactant. The above-mentioned surfactant can be selected from the groups consisting of alcohol solution, acetone solution and their combination freely.

In an embodiment of the present invention, the above-mentioned gate can be disposed on a substrate, and the substrate could be a glass substrate or a plastic substrate.

Therefore, the advantage and spirit of the present invention can be understood further by the following detail description of invention and attached Figures.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

Figure 1A:
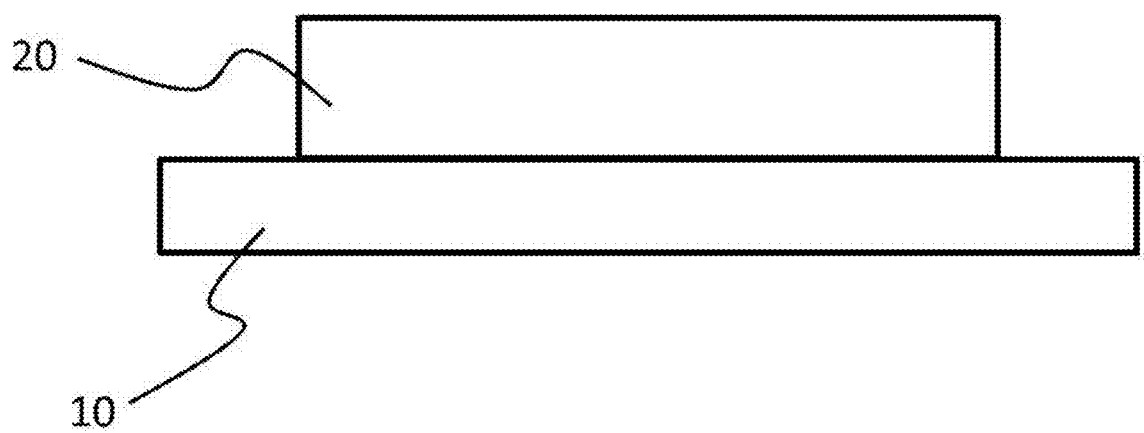
FIG. 1A, FIG. 1B, and FIG. 1C show the preparation process of semiconductor device in a preferred embodiment according to the present invention.
Figure 1B:
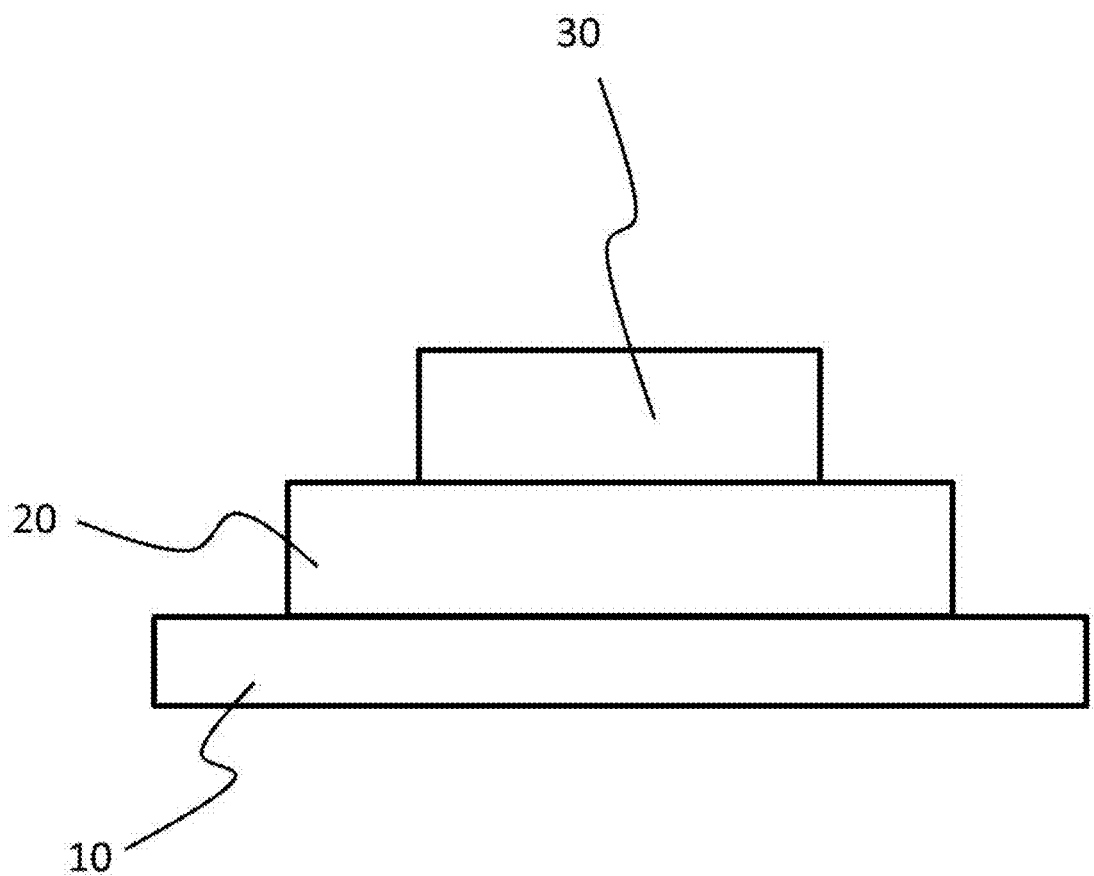
Figure 1C:
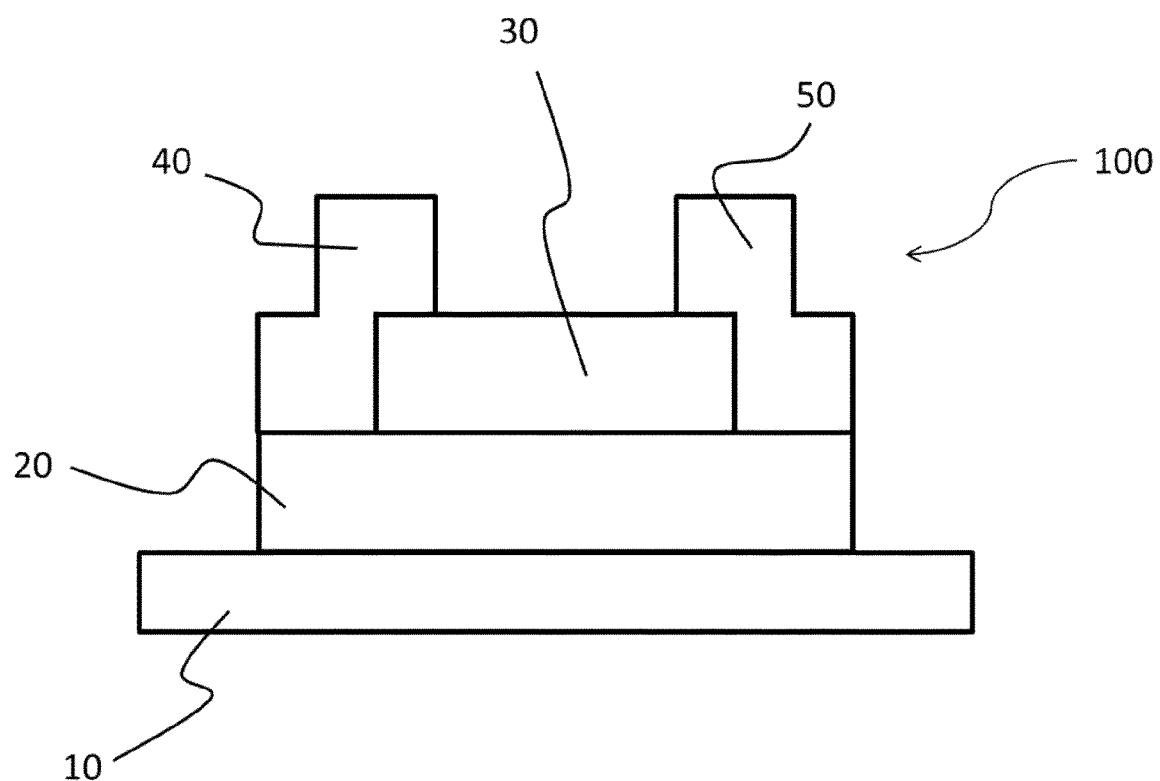
Figure 2:
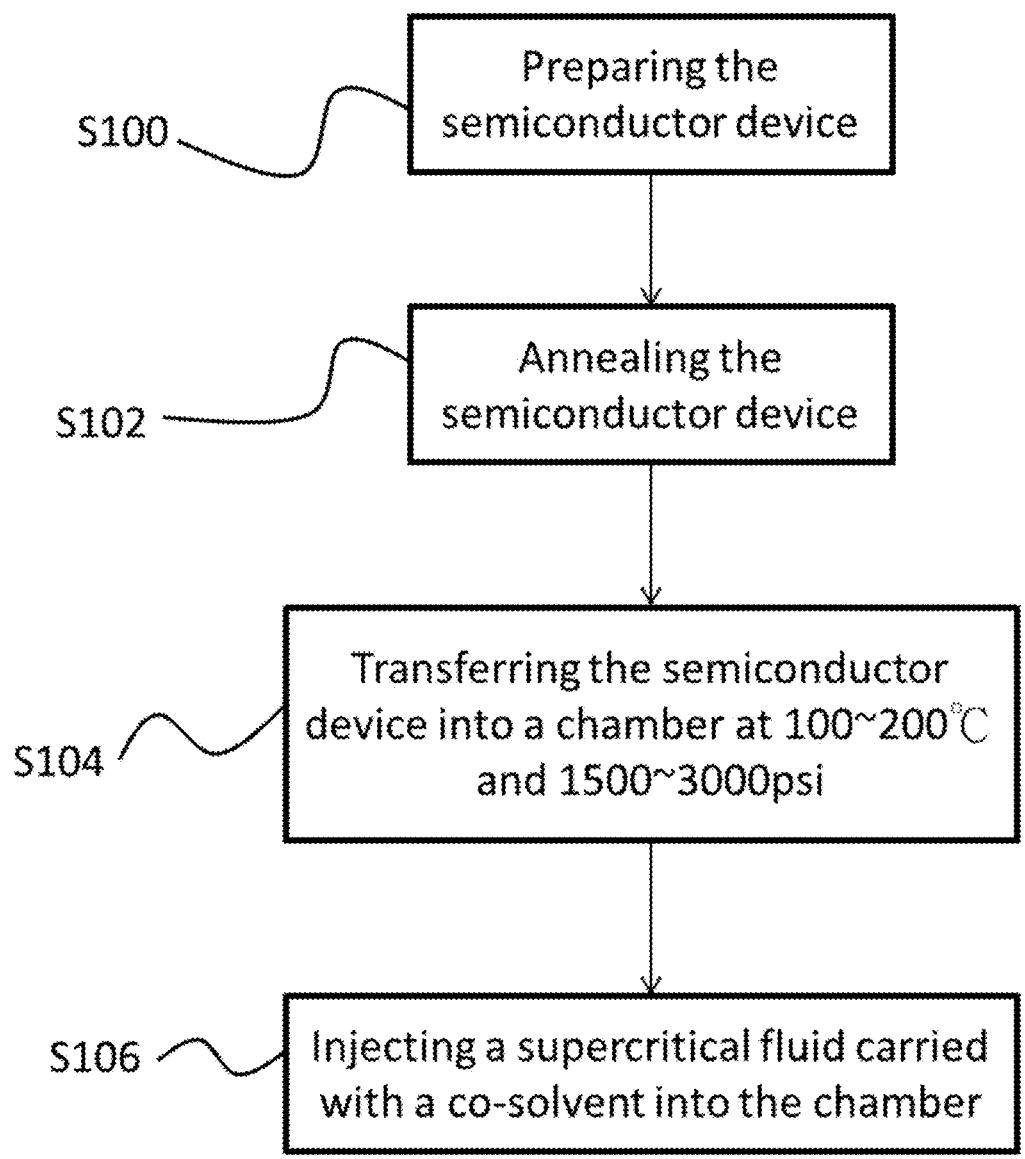
FIG. 2 shows the follow-up treatment process of semiconductor device in a preferred embodiment according to the present invention.

Please refer to FIG. 1A, FIG. 1B, FIG. 1C, and FIG. 2. FIG. 1A, FIG. 1B, and FIG. 1C show the preparation process of semiconductor device in a preferred embodiment according to the present invention. FIG. 2 shows the follow-up treatment process of semiconductor device in a preferred embodiment according to the present invention. Firstly, as shown in FIG. 2, a semiconductor device is prepared in the Step S100. In a preferred embodiment, the preparation of semiconductor device 100 is started from providing a substrate. The substrate can be n$^+$ heavy doping silicon wafer and used as the gate 10 for the semiconductor device 100. Of course, in order to comply with the follow-up low-temperature and high-pressure treatment, the substrate may be a glass substrate or a plastic substrate, which can be further applied on the flexible display or the transparent display.

Then, as shown in FIG. 1A, a gate dielectric layer 20 is formed on the gate 10. Preferably, the gate dielectric layer 20 is a 100 nm silicon dioxide thin film, and this step is conducted in a 650° C. furnace, but it is not limited in the present invention.

Then, as shown in FIG. 1B, a metal oxide thin film 30 is formed on the gate dielectric layer 20, which is used as the active layer of the semiconductor device 100. It has to describe that in a preferred embodiment, the metal oxide thin film of the semiconductor device provided by the present invention does not contain the indium and gallium. Therefore, the preferred metal oxide thin film 30 is an aluminum zinc tin oxide thin film 30, but it is not limited in the present invention. The active layer 30 can also include other metal oxide without indium element and gallium element.

In addition, in a preferred embodiment, the aluminum zinc tin oxide thin film is an amorphous aluminum zinc tin oxide. Moreover, the RF magnetron sputtering system is used to form the aluminum zinc tin oxide thin film 30 on the gate dielectric layer 20. The process condition is shown as follows, but it is not limited in the present invention:

Target source: 3-in $Al_2O_3$—ZnO—$SnO_2$, and the atom ratio is 3:67:30

RF power: 80 W

Ambient gas: The ratio of oxygen and argon is 0.2

Pressure: $3 \times 10^{-3}$ torr (at room temperature)

Deposition thickness: 25 nm

It has to describe that in the present invention, the amorphous aluminum zinc tin oxide thin film is used to substitute the metal oxide thin film containing the rare scattering elements or rare elements, and used as the active layer, which is able to improve the problem of prior art effectively. In addition, the semiconductor device 100 will be further treated by low-temperature and high-pressure technology, and the characteristics will be verified in the following sections.

Finally, as shown in FIG. 1C, the source 40 and the drain 50 are disposed on the active layer 30 (aluminum zinc tin oxide thin film 30). Preferably, the source 40 and the drain 50 are the indium tin oxide thin film. The above-mentioned RF magnetron sputtering system is also used. The process condition is shown as follows, but it is not limited in the present invention:

Target source: 3-in ITO

RF power: 50 W

Ambient gas: Argon

Pressure: $3 \times 10^{-3}$ torr (at room temperature)

Deposition thickness: 70 nm

Preferably, a shadow mask can be used to form the active layer 30, the source 40 and the drain 50 directly. That is to say, after the width and pattern of the active layer 30, the source 40 and the drain 50 are designed and set, the sputtering system can be used to form them on the gate dielectric layer 20 directly through the above-mentioned shadow mask. However, the yellow light layout and etching technique can also be adopted for the above-mentioned step, but it is not limited in the present invention.

In a preferred embodiment, after the gate dielectric layer is formed on the gate, the following step is included: Conducting a first plasma treatment. In addition, after the active layer is formed on the gate dielectric layer, the following step is included: Conducting a second plasma treatment. It is to say that the plasma treatment will be conducted for the gate dielectric layer 20 and the active layer 30, respectively. Preferably, the hydrogen plasma is used for the first plasma treatment and the second plasma treatment, and the treatment time is 200 seconds, the power, working voltage and temperature are 50 W, 0.06 torr and 80° C., respectively, but it is not limited in the present invention.

The semiconductor device 100 prepared from the above-mentioned process (such as sputtering process) might have many defects which might reduce the performance of device. Thus, after the preparation of semiconductor device 100 is finished, a low-temperature and high-pressure technique is used for the follow-up treatment step in the present invention, as shown in FIG. 2.

Firstly, as shown in Step S102, an annealing treatment is conducted for the above-mentioned semiconductor device 100, so that it will possess the required characteristics of the semiconductor device. Preferably, the annealing temperature is between 300° C. and 450° C., and the treatment time is 1 hour. Because the hydrogen plasma treatment has been conducted for the gate dielectric layer 20 and the active layer 30 of the semiconductor device 100, the annealing temperature can be reduced to 300° C. preferably.

Then, as shown in Step S104, after annealing the semiconductor device 100, it will be transferred into a chamber. Preferably, the temperature in the chamber will be between 100° C. and 200° C., and the pressure in the chamber temperature is between 1500 and 3000 lb/int (psi).

Then, as shown in Step S106, injecting a supercritical fluid carried with a co-solvent into the chamber. The above-mentioned supercritical fluid can be selected from the groups consisting of carbon dioxide, oxygen, ammonia, nitrogen, hydrogen and water vapor freely. The co-solvent is water. In addition, the co-solvent further contains a surfactant, which is used to disperse the polar co-solvent in the nonpolar supercritical fluid uniformly, so that it can be carried in the structure of semiconductor device effectively. Thus, the above-mentioned surfactant can be selected from the groups consisting of alcohol solution, acetone solution and their combination. Preferably, the reaction time is 1 hour which includes the time for stabilizing the temperature and pressure in the chamber. Moreover, the supercritical fluid will be the mixture of 50 vol. % acetone and 50 vol. % pure water, but it is not limited in the present invention.

Therefore it is known after the co-solvent (i.e. water molecule) of the supercritical fluid enters into the semiconductor device, the defects the semiconductor device can be modified by the oxidization ability of water.

Please refer to FIG. 3A, FIG. 3B, FIG. 3C, and FIG. 3D. FIG. 3A, FIG. 3B, FIG. 3C, and FIG. 3D show the analysis results for the characteristics of the semiconductor device after treated by low-temperature and high-pressure technique in a preferred embodiment according to the present invention. It is verified that the performance of semiconductor device can really be improved by the process provided by the present invention through a series of the intersection of reliability analysis and material analysis.

Figure 3A:
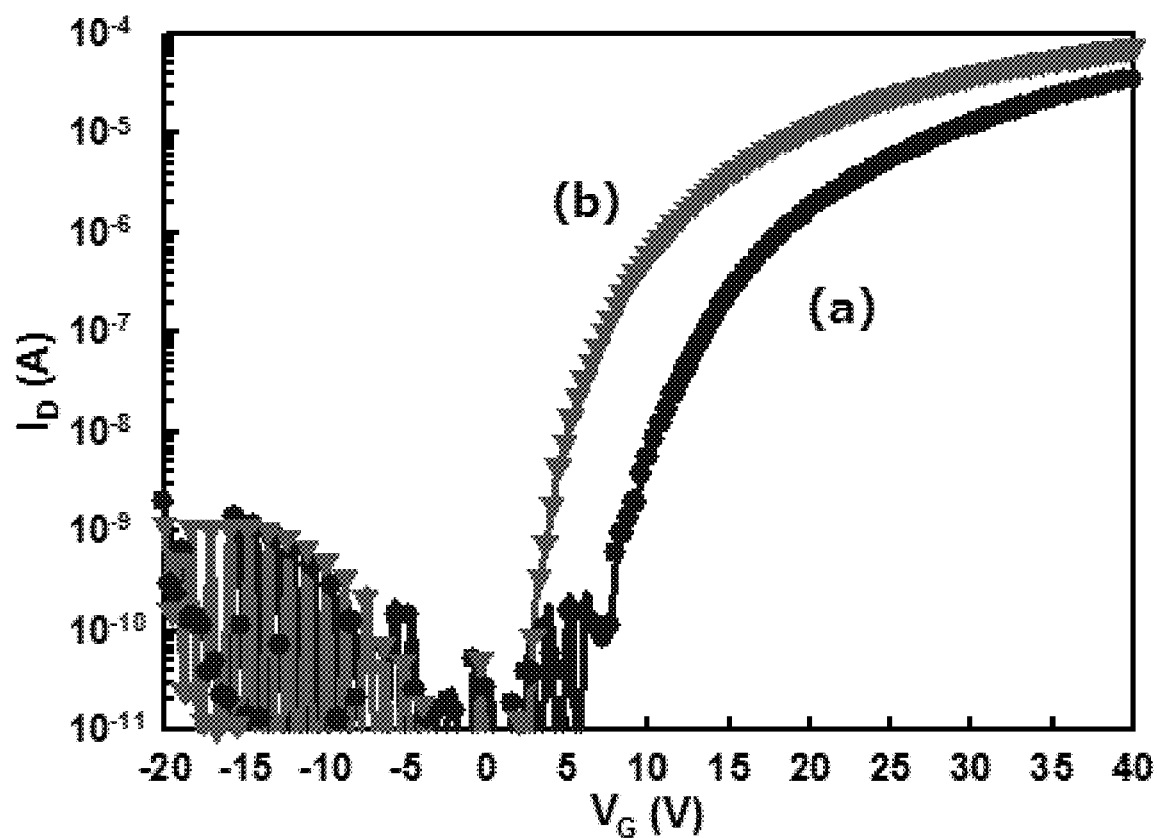
FIG. 3A, FIG. 3B, FIG. 3C, and FIG. 3D show the analysis results for the characteristics of the semiconductor device after treated by low-temperature and high-pressure technique in a preferred embodiment according to the present invention.
Figure 3B:
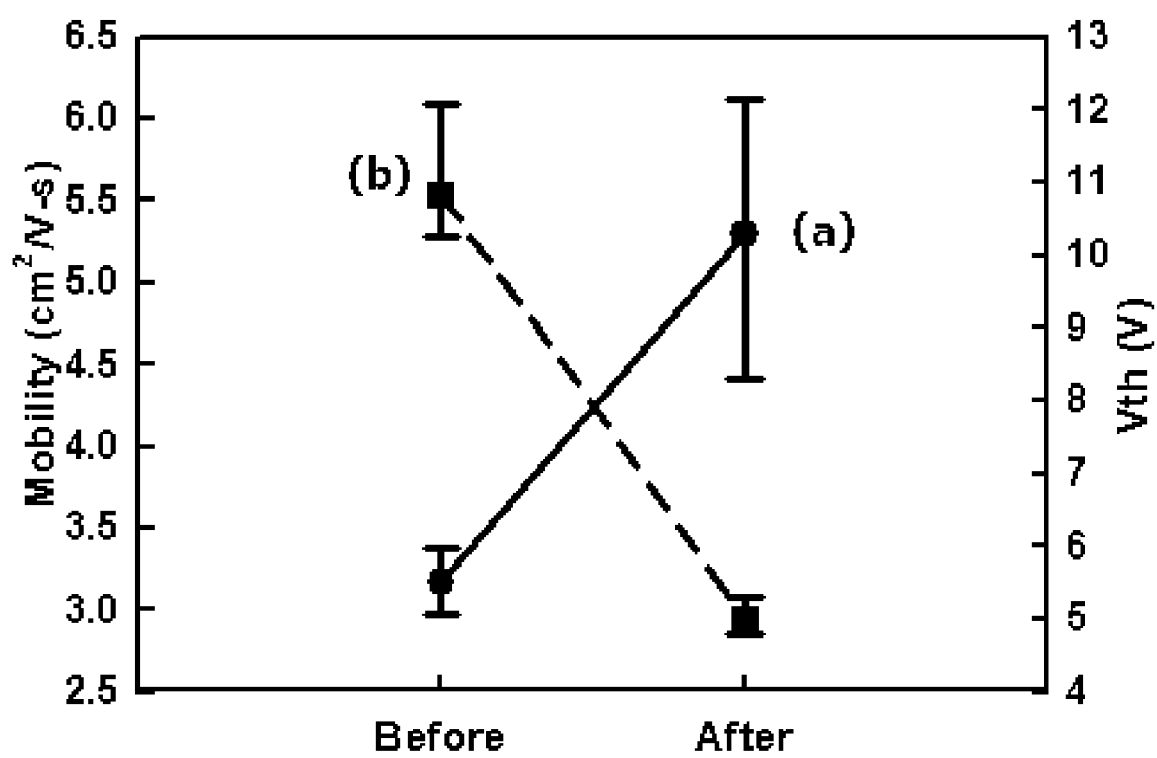

Firstly, as shown in FIG. 3A, FIG. 3A shows the transfer characteristic curve for the semiconductor device before and after the treatment in a preferred embodiment according to the present invention, wherein which ID is the drain current and $V_G$ is the gate current. As shown in figure, after annealing and the supercritical fluid treatment, the basic characteristic of semiconductor device (b) has been improved significantly compared to the untreated semiconductor device (a). Then, FIG. 3B shows the mobility and start voltage change for the semiconductor device before and after the treatment in a preferred embodiment according to the present invention. It is known that the supercritical fluid can effectively bring water into thin film structure to modify the defects in thin film, so that the whole defects density of the semiconductor device can be reduced greatly. The basic electric characteristic (such as the mobility and start voltage) of the semiconductor device can also be improved effectively.

Figure 3C:
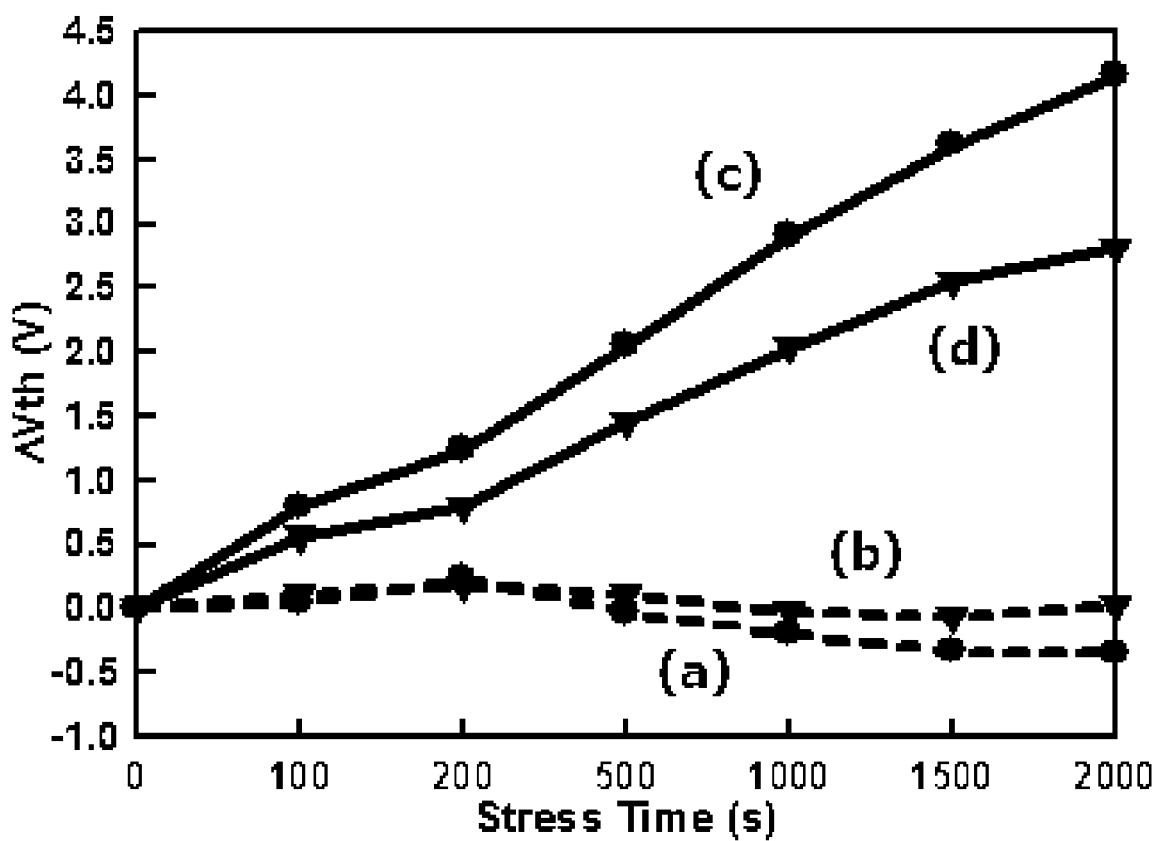

Moreover, please refer to FIG. 3C, which shows the reliability test for the positive, negative bias of the semiconductor device before and after the treatment in a preferred embodiment according to the present invention, in which the curve (a) represents the reliability of negative bias for the semiconductor device before treatment, the curve (b) represents the reliability of negative bias for the semiconductor device after treatment, the curve (c) represents the reliability of positive bias for the semiconductor device before treatment, and the curve (d) represents the reliability of positive bias for the semiconductor device after treatment. As shown in figures, the influence is less by the negative gate bias stress for the treated semiconductor device, and its degradation is minimum the positive gate bias stress.

Figure 3D:
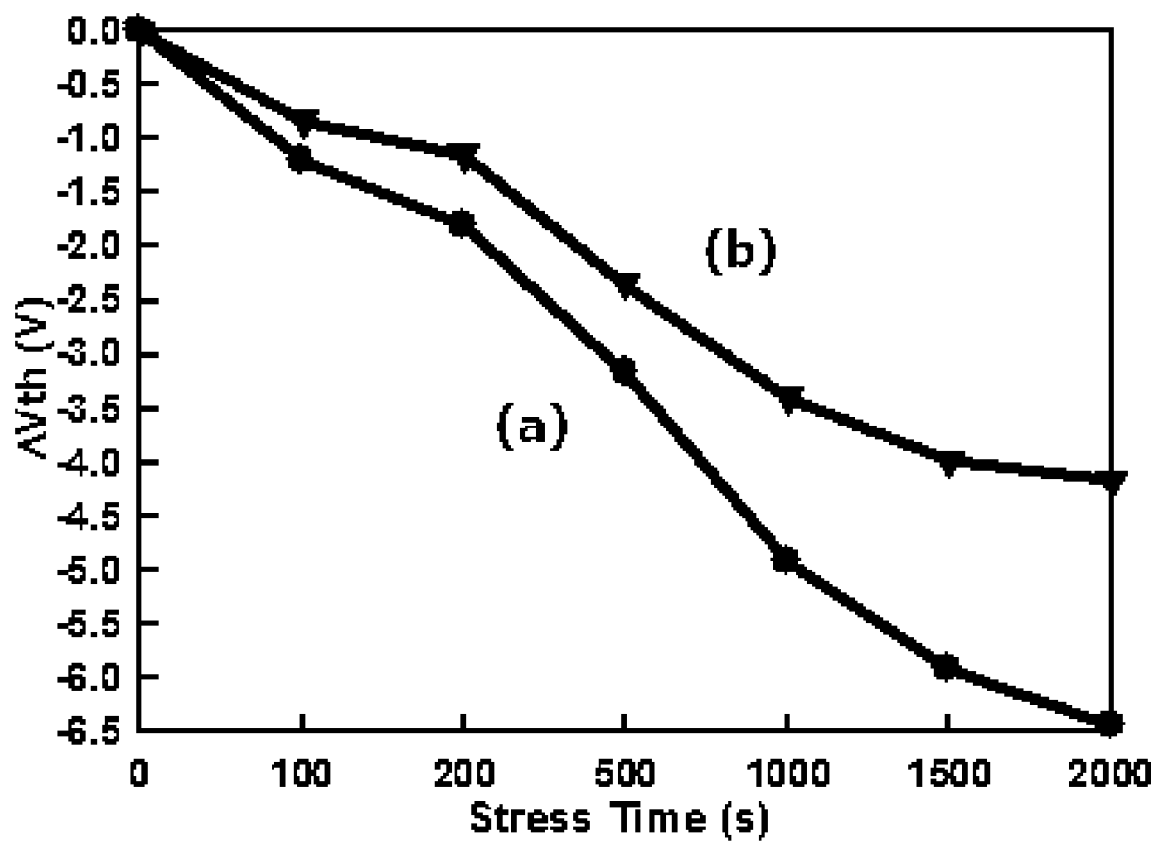

Finally, please refer to FIG. 3D, which shows the illumination and negative bias test of the semiconductor device before (a) and after (b) the treatment in a preferred embodiment according to the present invention, that is the measurement of light sensitivity. As shown in figures, although the semiconductor device is degraded under the negative gate bias illumination stress, but the influence is less for the treated semiconductor device.

In summary, the present invention employs three-dimension amorphous aluminum tin oxide semiconductor to substitute indium gallium oxide semiconductor as the active layer of the semiconductor device. The supercritical fluid with high gas diffusivity and high liquid loading ability is used to bring the co-solvent into the sputtering deposition thin film. The defects of device can be modified successfully at low-temperature environment, and the electric characteristic of amorphous aluminum zinc tin oxide thin film transistor can be improved. The whole process can be applied in future innovative display technology.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. A method of manufacturing a semiconductor device by conducting first and second hydrogen plasma treatments, annealing the semiconductor device, and injecting a supercritical fluid carried with a co-solvent to modify defects in the semiconductor device, comprising:
    forming a gate dielectric layer on a gate by conducting a first hydrogen plasma treatment;
    forming an active layer on the gate dielectric layer by conducting a second hydrogen plasma treatment;
    disposing a source and a drain on the active layer, wherein the semiconductor device having a plurality of defects, and the active layer being a metal oxide thin film;
    annealing the semiconductor device, wherein the temperature for annealing the semiconductor device is between 350° C. and 450° C.;
    transferring the semiconductor device into a chamber at 100° C. to 200° C. and 1500 psi to 3000 psi; and
    injecting a supercritical fluid carried with a co-solvent into the chamber and at a reaction time for 1 hour to modify the plurality of defects, the supercritical fluid is selected from the groups consisting of oxygen, ammonia, and hydrogen, wherein the co-solvent comprises;
    water; and
    a surfactant, wherein the surfactant is selected from the group consisting of alcohol solution, acetone solution and the combination thereof.

2. A method of manufacturing semiconductor device by conducting first and second hydrogen plasma treatment, annealing the semiconductor device, and injecting a supercritical fluid carried with a co-solvent to modify defects of the semiconductor device, comprising:
    forming a gate dielectric layer on a gate by conducting a first hydrogen plasma treatment;
    forming an active layer on the gate dielectric layer by conducting a second hydrogen plasma treatment;
    disposing a source and a drain on the active layer, wherein the semiconductor device having a plurality of defects, and the active layer being a metal oxide thin film;
    annealing the semiconductor device, wherein the temperature for annealing the semiconductor device is between 350° C. and 450° C.;
    transferring the semiconductor device into a chamber at 100° C. to 200° C. and 1500 psi to 3000 psi; and
    injecting a supercritical fluid carried with a mixture of 50 vol. % acetone solution and 50 vol. % pure water into the chamber and at a reaction time for 1 hour to modify the plurality of defects, the supercritical fluid is selected from the groups consisting of oxygen, ammonia, and hydrogen.

3. The method according to claim 2, wherein the acetone solution further comprises alcohol solution and the combination thereof.

4. A method of manufacturing semiconductor device by conducting first and second hydrogen plasma treatment, annealing semiconductor device, and injecting a supercritical fluid carried with a co-solvent to modify defects of semiconductor device, comprising:
    forming a gate dielectric layer on a gate by conducting a first hydrogen plasma treatment;
    forming an active layer on the gate dielectric layer by conducting a second hydrogen plasma treatment;
    disposing a source and a drain on the active layer, wherein the semiconductor device having a plurality of defects, and the active layer being a metal oxide thin film;
    annealing the semiconductor device, wherein the temperature for annealing the semiconductor device is between 350° C. and 450° C.;
    transferring the semiconductor device into a chamber at 100° C. to 200° C. and 1500 psi to 3000 psi; and
    injecting a supercritical fluid carried with a mixture of 50 vol. % acetone solution and 50 vol. % pure water into the chamber and at a reaction time is 1 hour to modify the plurality of defects, the supercritical fluid is selected from the groups consisting of carbon dioxide, oxygen, ammonia, and hydrogen.

5. The method according to claim 4, wherein the acetone solution further comprises alcohol solution and the combination.

* * * * *